(12) United States Patent
Maass et al.

(10) Patent No.: US 9,347,131 B2
(45) Date of Patent: May 24, 2016

(54) COATING SUBSTRATES WITH AN ALLOY BY MEANS OF CATHODE SPUTTERING

(75) Inventors: Wolfram Maass, Linsengericht (DE); Berthold Ocker, Hanau (DE); Jürgen Langer, Offenbach (DE)

(73) Assignee: SINGULUS TECHNOLOGIES AG., Kahl Am Main (DE)

( * ) Notice: Subject to any disclaimer, the term of this patent is extended or adjusted under 35 U.S.C. 154(b) by 0 days.

(21) Appl. No.: 13/261,511

(22) PCT Filed: Sep. 28, 2011

(86) PCT No.: PCT/EP2011/066895
§ 371 (c)(1),
(2), (4) Date: May 14, 2013

(87) PCT Pub. No.: WO2012/041920
PCT Pub. Date: Apr. 5, 2012

(65) Prior Publication Data
US 2013/0228451 A1    Sep. 5, 2013

(30) Foreign Application Priority Data
Sep. 28, 2010 (DE) .......................... 10 2010 046 780

(51) Int. Cl.
*C23C 14/35* (2006.01)
*H01J 37/34* (2006.01)
*C23C 14/34* (2006.01)

(52) U.S. Cl.
CPC ............. *C23C 14/35* (2013.01); *C23C 14/3407* (2013.01); *H01J 37/3405* (2013.01); *H01J 37/3429* (2013.01)

(58) Field of Classification Search
CPC .. C23C 14/3407; C23C 14/35; C23C 14/352; H01J 37/3429; H01J 37/3408
USPC .............................. 204/192.12, 298.2, 298.19
See application file for complete search history.

(56) References Cited

U.S. PATENT DOCUMENTS 4,488,956 A * 12/1984 Scherer et al. ........... 204/298.23
4,505,798 A    3/1985 Ramachandran ............. 204/298

(Continued)

FOREIGN PATENT DOCUMENTS

EP    1626432 A1    2/2006    ............... H01J 37/34
JP    62-230971    10/1987

(Continued)

OTHER PUBLICATIONS

Office Action dated May 27, 2015 from corresponding Russian Application No. 2012155348/02(087696), 5 pages.

(Continued)

*Primary Examiner* — Rodney McDonald
(74) *Attorney, Agent, or Firm* — Ohlandt, Greeley, Ruggiero & Perle, L.L.P.

(57) ABSTRACT

The invention relates to a target for coating a substrate with an alloy by means of cathode sputtering, said alloy having at least one first material and one second material as alloy components. The surface of the target has at least one first section made of the first material and one second section made of the second material. The two sections adjoin each other and form a common boundary line. The invention further relates to a device and a method for coating a substrate with an alloy by means of cathode sputtering using the target according to the invention.

10 Claims, 10 Drawing Sheets

(56) References Cited

U.S. PATENT DOCUMENTS

| | | | |
|---|---|---|---|
| 4,610,774 A | 9/1986 | Sakata et al. | |
| 4,971,674 A * | 11/1990 | Hata | 204/192.2 |
| 5,190,630 A | 3/1993 | Kikuchi et al. | 204/192.12 |
| 5,427,665 A * | 6/1995 | Hartig et al. | 204/192.12 |
| 6,464,844 B1 | 10/2002 | Pichulo et al. | 204/192.15 |
| 6,692,619 B1 | 2/2004 | Chen et al. | 204/192.2 |
| 6,709,557 B1 | 3/2004 | Kailasam | 204/298.13 |
| 2002/0162737 A1 | 11/2002 | Durs | 204/192.12 |
| 2003/0085114 A1 | 5/2003 | Johnson et al. | 204/192.12 |
| 2004/0178056 A1 * | 9/2004 | De Bosscher et al. | 204/192.12 |
| 2004/0206620 A1 | 10/2004 | Wang et al. | 204/192.12 |
| 2005/0115822 A1 | 6/2005 | Maass et al. | 204/192.2 |
| 2005/0274610 A1 | 12/2005 | Iseki | |
| 2009/0068503 A1 * | 3/2009 | Yamazaki et al. | 429/12 |

FOREIGN PATENT DOCUMENTS

| | | | |
|---|---|---|---|
| JP | 63-192863 | * | 8/1988 |
| JP | 62-252311 | | 10/1988 |
| JP | 2005-336520 A | | 12/2005 |
| RU | 2308538 C1 | | 10/2007 |

OTHER PUBLICATIONS

Japanese Office Action dated Jan. 27, 2015 from corresponding Japanese Patent Application No. 2013-529678, 9 pages.

* cited by examiner

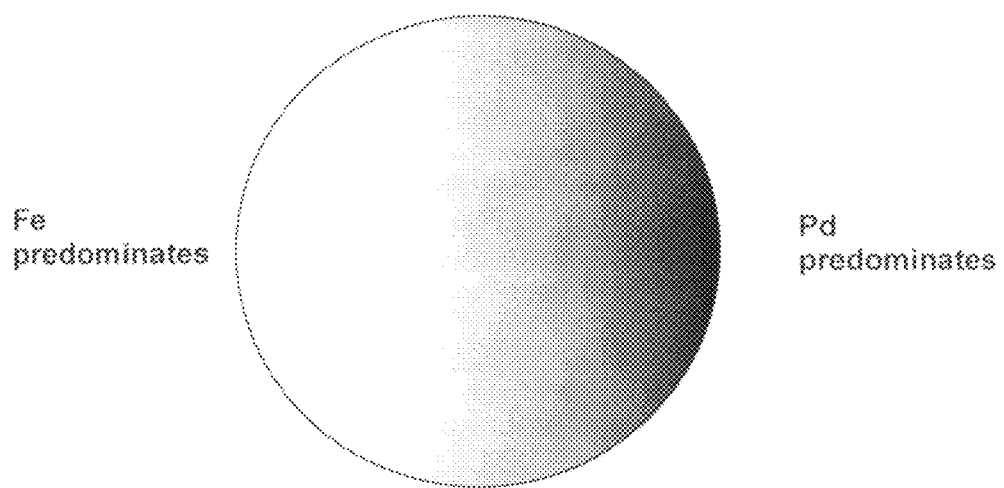

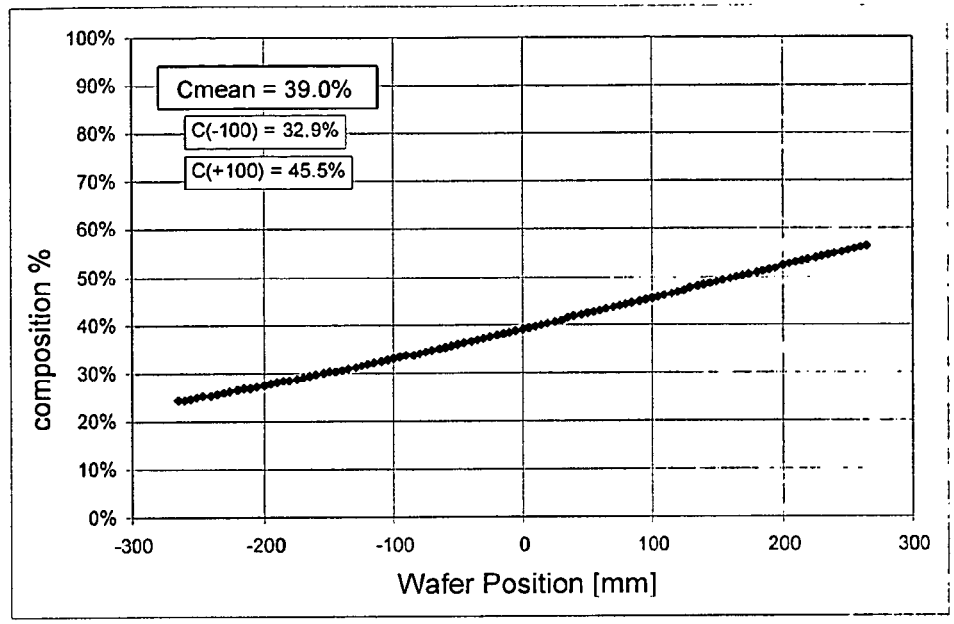
Figure 8
Figure 9a
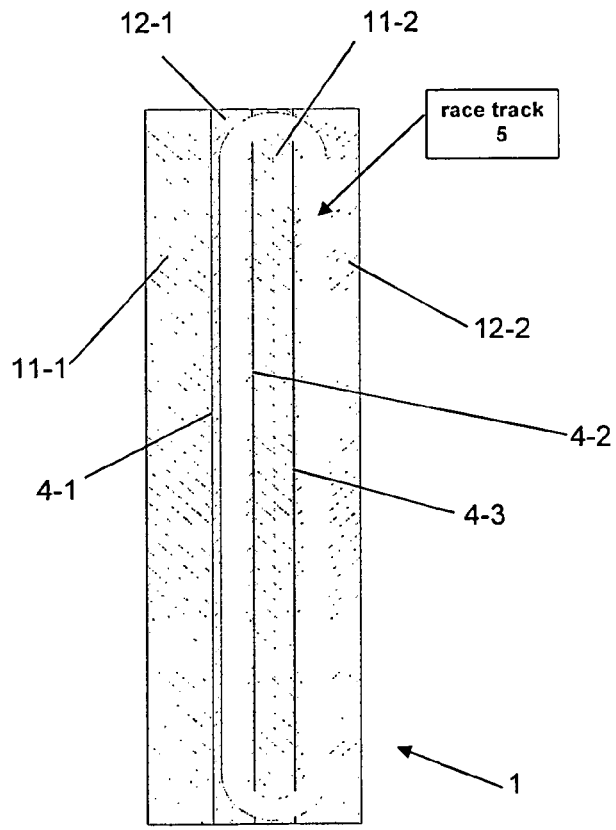

COATING SUBSTRATES WITH AN ALLOY BY MEANS OF CATHODE SPUTTERING

This Patent Application is a U.S. National Phase Patent Application from PCT Application No. PCT/EP2011/066895, filed Sep. 28, 2011 and claiming priority from German Patent Application No. 102010046780.4 filed Sep. 28, 2010.

FIELD OF THE INVENTION

The present invention relates to the production of thin layers on a substrate by means of cathode sputtering, in particular magnetron cathode sputtering. The present invention particularly relates to the coating of a substrate with an alloy having a defined alloy composition and/or a defined change in the alloy composition across the surface of the substrate, i.e. a defined concentration gradient which comprises materials of the alloy.

BACKGROUND TO THE INVENTION

A method and a device for coating a substrate by means of cathode sputtering is known, e.g., from WO 03/071579. Said document discloses a sputtering cathode by means of which a coating of a substrate can be produced in particular by using magnetic and/or magnetizable materials. The sputtering cathode comprises a cathode base body, a target arranged thereon and a magnet arrangement arranged behind the target. In order to be able to align the light magnetization axis of the material to be applied, the sputtering cathode further comprises means for generating an external magnetic field having magnetic field lines extending substantially parallel in the plane of the substrate. The cathode is preferably a long cathode having a length corresponding to at least a diameter of the substrate. For achieving a homogeneous coating, the substrate to be coated is moved during cathode sputtering below the long cathode in a direction transversely with respect to the longitudinal side of the long cathode in the substrate plane.

In order to achieve specific layer properties when using thin layers applied in this manner, a very particular composition of the deposited layer might be necessary.

Examples of such layers are $Ni_{(1-x)}Fe_x$, wherein x=0.18 ... 0.45, or $Pt_{(1-x)}Mn_x$, wherein x≈0.5, wherein specific properties of the layers depend on the exact value x. For producing layers of this kind, targets consisting of the desired ratio of the alloy to be applied are used.

However, in the field of research and development it is in most cases unknown which alloy composition of a specific layer leads to the best results for the specific purpose. It is a further problem—mainly in case materials having clearly different atomic masses are used—that during cathode sputtering the alloy composition can change during the deposition. The alloy composition of the layer deposited on the substrate thus can be more or less changed as compared to the alloy composition in the sputtering target, e.g. when using PtMn. Moreover, this change depends on the parameters of the coating process, e.g., the process pressure, the coating rate, etc. Since in the end the composition of the alloy on the substrate is important, it is often difficult to determine the optimum composition of the alloy of the sputtering target.

An often used but very inflexible method for adjusting alloys of thin layers that are deposited by means of cathode sputtering is based on the use of a series of sputtering targets with different alloy compositions that may be very close to one another. This method is very costly, in particular in case expensive materials (PtMn, FePt, etc.) are used. A plurality of targets with corresponding alloys must be produced and/or bought, wherein after corresponding series tests using the different targets, in the end only one target thereof comes close to the optimum alloy and can actually be used.

In these series tests, the corresponding targets must be inserted in and removed from the corresponding vacuum systems, which is very time-consuming.

Adjusting the alloy composition of alloy layers on a substrate by means of the coating process itself, i.e. by means of externally adjustable changes to the coating process and/or the coating geometry is, as compared thereto, a clearly simpler, faster and as a rule also more cost-efficient method.

A method that is very often used in this regard is the so-called co-sputtering. According to this method, the substrate is typically coated simultaneously by two (or more) sputtering cathodes each using different target materials. By changing the power ratio of both cathodes, also the ratio of the two material amounts, i.e. the alloy composition, on the substrate is changed. Mainly when using relatively large substrates it is difficult in connection with this technology to produce a homogeneous alloy on the substrate and at the same time achieve a homogeneous layer thickness. For improving the layer thickness homogeneity, the substrate is rotated during the deposition.

In accordance with another method, multiple layers of the two (or also more than two) materials are alternatingly applied to the substrate and then—typically in the vacuum—exposed to a suitably high temperature ("tempering"). This is said to cause a diffusion process leading to a mixing or homogenization of the materials and thus finally producing the desired alloy. The alloy composition is adjusted by selecting the primary layer thicknesses. For this method to function it is necessary that the diffusion process can be carried out at suitable temperatures and in a reasonably short time. Therefore, this method is restricted to a limited number of materials—also among the metals.

Further prior art is known from U.S. Pat. Nos. 5,190,630 A, 4,505,798 A, EP 1 626 432 A1, US 2005/0274610 A1 and WO 03/71579 A1.

SUMMARY OF THE INVENTION

It is an object of the invention to provide a device and a method for applying a thin layer of a homogeneous alloy onto a substrate, wherein the alloy composition can be adjusted or changed in a controlled manner. It is a further object of the invention to locally vary the alloy composition on the substrate, i.e. to produce an alloy gradient, so that the respective concentration of the alloy components in the applied layer changes in a controlled manner depending on the position on the substrate. Both a change in the alloy composition and the adjustment of the alloy gradient lead to a change in the alloy ratio.

In accordance with the invention, these objects are achieved by the features of the claims.

The present invention is based on the principle idea to coat a substrate, which has a width and a length, wherein the width and the length can be equal, by means of magnetron cathode sputtering with an alloy, wherein a target and a magnetron magnet arrangement being arranged behind the target when viewed from the substrate to be coated are used. According to the invention, a specific target is used, whose surface is made of at least two sections which are each made of different materials that are to form the alloy of the layer. The different materials are arranged on the surface of the target so that during operation material from both sections is removed simultaneously in an erosion section or trench. By suitably positioning the erosion section or trench relative to the boundary line between the two material sections of the target, the part of the two target sections covered by the erosion section or trench and thus accordingly the alloy ratio on the substrate are changed. According to the invention, this positioning is realized by moving, rotating and/or tilting the magnet arrangement relative to the material boundary line of the target.

If the boundary line between the two sections extends parallel to the direction of the course of the erosion section, constant amounts of the two materials are removed along the length of the erosion section, and a constant alloy is formed on the substrate in the longitudinal direction of the erosion section. By moving the erosion section transversely with respect to the boundary line, the alloy ratio can be changed. If the erosion section is moved before the substrate is moved, the alloy composition is adjusted. Moving the erosion section and at the same time moving the substrate during the ongoing operation leads to the formation of an alloy gradient on the substrate along the movement direction of the substrate.

If the boundary line between the two sections extends at an acute angle, for example smaller than 20°, relative to the direction of the erosion section, an alloy gradient is formed on the substrate to be coated in the direction of the erosion section because along the course of the erosion section different amounts of the two materials are removed and thus at one side more material of the one section and at the other side more material of the other section is removed, wherein in between a continuous transition of the alloy composition is achieved.

A change in the alloy ratio can also be achieved by adjusting an angle $\beta$ between the surface of the magnet arrangement and the surface of the target facing the substrate.

According to the invention, the plasma can also have a circular or elliptical cross-section so that the erosion section is accordingly formed as a circle or ellipse. By moving the plasma transversely with respect to the target boundary line, the alloy composition on the coated substrate is changed. If it is intended to form a layer from an alloy with more than two materials, it is possible to arrange the sections of different materials in different manners on the target surface. For example, the sections of the different materials can be arranged in a star-shaped manner on the target surface. By moving the circular or elliptic erosion section relative to such a star-shaped arrangement parallel with respect to the surface of the target, the respective amounts of the materials forming the alloy can be freely selected.

In accordance with an embodiment of the invention, the alloy ratio can be changed by moving the magnet arrangement relative to the surface of the substrate and/or by moving the substrate relative to the surface of the magnet arrangement, preferably by a movement in directions being perpendicular with respect to one another. If the magnet arrangement is moved before the substrate is moved, the alloy composition is adjusted. Moving the magnet arrangement and at the same time moving the substrate leads to the formation of an alloy gradient on the substrate along the relative movement.

According to a preferred embodiment of the invention, when using an elongate magnetron sputtering cathode, i.e. a long cathode, extending across the width of the substrate and an elongate magnet arrangement having a width and a length, the alloy ratio is changed by aligning the length of the magnet arrangement parallel or at an acute angle $\alpha$ with respect to the boundary line on the target surface.

According to the invention, the alloy ratio can be changed by tilting the magnet arrangement about an axis relative to the target surface by an angle $\beta$. Tilting the magnet arrangement changes the rate of target removal on the two erosion trenches formed along the target relatively to one another, so that the composition or concentration of the alloy and/or the alloy gradient can be varied.

In a magnetron sputtering cathode, permanent magnets are often used for the magnet arrangement. According to the invention it is alternatively also possible to use electromagnets instead of permanent magnets.

According to a preferred embodiment of the invention, the target is substantially rectangular. During coating, the substrate to be coated is moved below the target at the side facing away from the magnet arrangement in a direction parallel to the transverse direction of the target.

For achieving that the boundary line between the two sections extends at an acute angle $\alpha$ relative to the direction of the erosion section, the sections of the surface of the target can be trapezoidal, wherein these trapezoidal sections are arranged such that strips of different materials are formed on the surface of the rectangular target, the boundary lines of these strips being tilted relative to the longitudinal side of the target by an angle. In a typically structured device for large-area cathode sputtering and in particular for magnetron cathode sputtering with a long cathode, a race track-shaped erosion section is formed on the target, wherein two elongate trenches are formed in the longitudinal direction of the target. For these two trenches, a homogeneous transition between the materials should be realized. Therefore, preferably three trapezoidal sections are provided. It is thus possible to achieve a structure in which the boundaries between the sections of different materials extend at an acute angle $\alpha$ relative to the direction of the straight sections of the race track-shaped erosion section, so that at one end more material of the one section and at the other end more material of the other section is removed. In case of a relative movement of the substrate substantially perpendicular with respect to the longitudinal direction of the long cathode, a corresponding different alloy composition is obtained in the transverse direction of the substrate.

In turn, for achieving a constant alloy composition along the length of the target and thus across the width of the substrate, it must be guaranteed that the erosion section extends substantially parallel to and along the boundary line between the two sections. For this purpose it is preferable to use a target whose surface is composed of a plurality of individual rectangular sections so that the materials of the sections alternate. Thus, strips of different materials are formed on the surface of the target, the boundary lines of these strips extending parallel to the longitudinal direction of the target. If four sections are used, wherein always two sections are made of the same material, two homogeneous boundary lines between the two materials can be achieved on the target, which is desired in case of a race track-shaped structure of the erosion section. By moving the erosion section in the transverse direction of the target, i.e. perpendicularly with respect to the boundary lines between the sections, the ratio between the two materials can be adjusted, depending on the size of the portion of the erosion section lying on the one or the other material section of the target.

For achieving a target surface structure consisting of different sections, the target can be combined of a plurality of individual pieces whose surfaces form the sections of the surface of the target. In this case, at least one of the individual pieces is made of the first material and at least a further one of the individual pieces is made of the second material. Instead of combining the target of differing individual target pieces, it is also possible to make a target of one of the materials and to apply a layer of the second material at the desired places so as to form the various sections at least at the target surface. This is particularly advantageous in case one of the two materials of the desired alloy is non-ferromagnetic. In this case, the target is made of the ferromagnetic material and the second non-ferromagnetic material is applied to the base material.

It is also possible to make alloys of more than two materials. For this purpose, a plurality of sections of the desired materials must be arranged in an appropriate manner on the target.

The position of the erosion section, which is determined by the position of the magnetron magnet arrangement, can be moved by moving this magnet arrangement relative to the surface of the target, for example in a direction transversely with respect to the longitudinal direction or the boundary line of the target. When producing a concentration gradient by means of the accordingly realized target, the steepness of the concentration gradient can be adjusted by such a movement.

According to the invention, relative to the longitudinal direction of the long cathode, an alloy gradient, i.e. a change in the alloy composition of, e.g. a binary alloy, can be produced in the alloy layer on the substrate relative to the position in the coated substrate. According to the invention, the steepness of the alloy gradient or the value of the mean value of the material concentration can be adjusted by changing machine parameters. Moreover, it is also possible to adjust a defined homogeneous alloy concentration with different values across the surface of the substrate. The alloy ratio is changed depending on the position of the magnetron sputtering cathode over the substrate.

BRIEF DESCRIPTION OF THE DRAWINGS

In the following, the present invention will be explained in more detail with reference to the attached drawings in which

FIG. 6 is a schematic top view of a circular substrate with a coating with a concentration gradient produced in accordance with the invention;

FIG. 8 shows the alloy composition with reference to the substrate position with a defined mean value;

FIG. 9a is a top view of the structure of a target of a further embodiment of the invention and FIG. 9b is a schematic view of a coating device according to the invention with said target;

DETAILED DESCRIPTION OF THE INVENTION

Figure 1A:
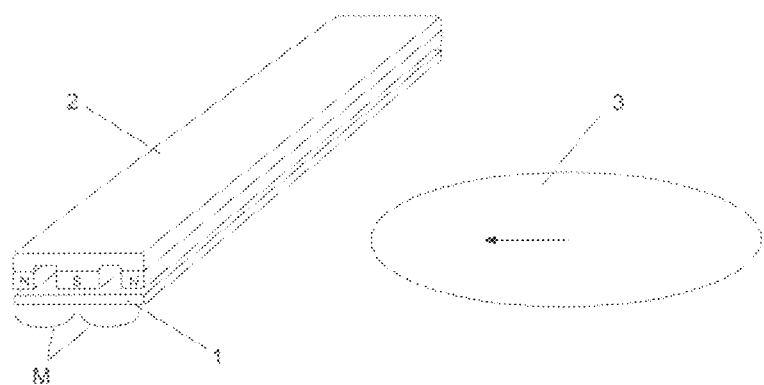
FIG. 1a shows a schematic view of the cathode sputtering device used in accordance with the invention and FIG. 1b shows a top view of the movement of the substrate to be coated during coating.
Figure 1B:
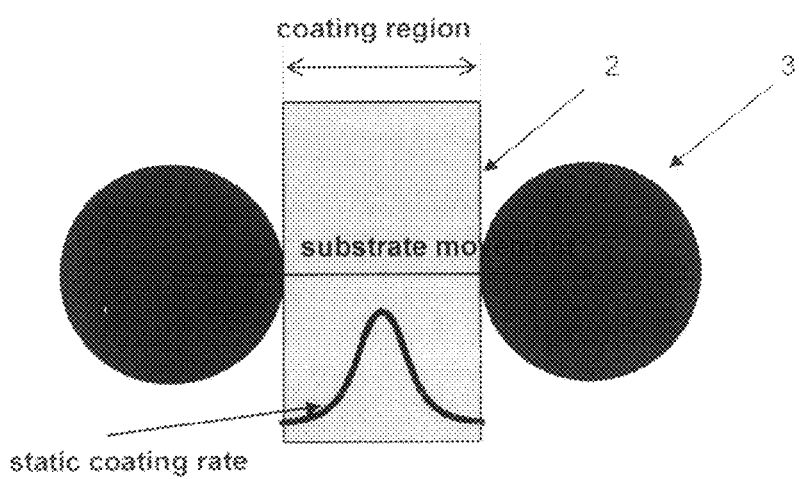

The present invention is based on the so-called linear dynamic deposition (LDD) technology as used, e.g., also in coating systems of the type TIMARIS of Singulus Technologies AG. The basic principle used therein is known, e.g., from WO 03/071579 already cited above. FIG. 1 schematically shows a structure of a corresponding cathode sputtering system which can also be used in accordance with the present invention. The device in the form of a long cathode comprises a long target 1 and an accordingly elongate magnetron magnet arrangement 2 arranged thereon. The magnet arrangement 2 with magnetic poles N-S-N generates a magnetic field, which is shown in FIG. 1a by the magnetic field lines M indicated below the target 1. A layer of the material of target 1 can be applied to a substrate 3 being arranged below the target 1 when viewed from the direction of the magnetic field arrangement. FIG. 1b illustrates in a top view the static coating rate achieved under the target 1 in a coating section. For generating a homogeneous layer on the substrate 3, the substrate 3 is moved in its plane below the target, as indicated in FIGS. 1a and 1b by means of arrows.

Figure 2A:
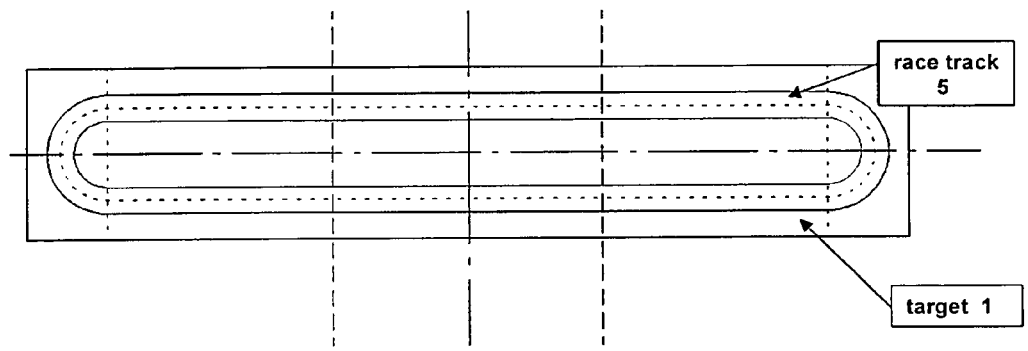
FIG. 2a shows the erosion section formed on the surface of the target during magnetron cathode sputtering.

FIG. 2a shows a target which can be used in a coating device according to FIG. 1a. In the top view shown in FIG. 2a, the target has a rectangular shape and accordingly has a longitudinal side and a transverse side defining a longitudinal direction of the long cathode and a transverse direction. By arranging the magnet arrangement 2 behind the target, as shown in FIG. 1a, a race track-shaped erosion section or trench 5, which is also referred to as race track, is formed during operation. In this position or in the resulting trench, material is removed from the target and can then be deposited on the substrate.

Figure 2B:
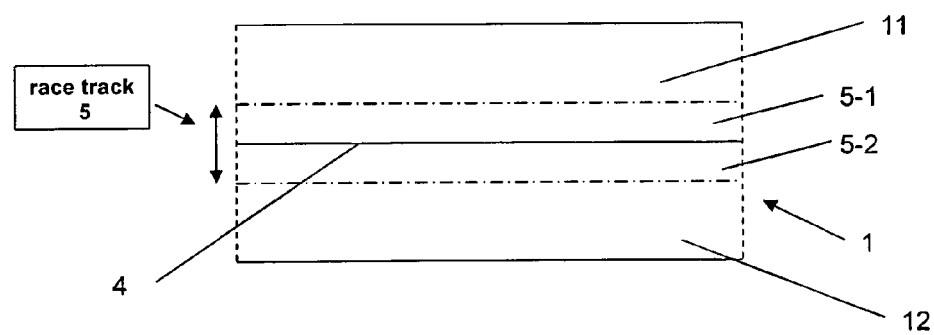
FIG. 2b shows a section of the erosion section on the surface of the target according to the invention.

According to the present invention, the cathode sputtering device uses a target whose surface comprises at least two different materials. FIG. 2b exemplarily shows a top view of the surface of such a target 1 with a first section 11 of a first material and a second section 12 of a second material. The two adjoining sections 11 and 12 form a boundary line 4. During operation, an erosion section (race track) 5 forms on the surface of the target, wherein FIG. 2b shows a section of the erosion section 5 whose extension in the width direction is indicated by dash-dotted lines. For forming an alloy on the substrate, the erosion section 5 must be arranged such that both materials are removed at the same time, i.e. the boundary line 4 lies in the area of the erosion section 5. This erosion section 5 is divided by the boundary line 4 of the target into two erosion sub-sections 5-1 and 5-2 (in FIG. 2b above and below the boundary line 4, respectively), in which the first and the second alloy material, respectively, are removed. FIG. 2b shows the situation in which the erosion section lies approximately symmetrically with respect to the boundary line and the two partial erosion sections have approximately the same width so that in each case substantially the same amount of the two materials is removed.

Figure 2C:
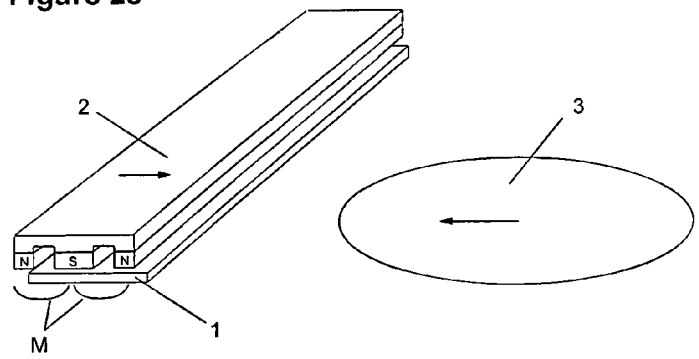
FIG. 2c shows a top view explaining the relative movement of the substrate to be coated and the magnet arrangement during coating according to a further embodiment of the invention.

If the position of the erosion section 5 is moved relative to the boundary line 4 before the substrate is moved in the ongoing operation, it can be achieved that more of the one or the other material is removed and the alloy composition is adjusted. Simultaneously moving the magnet arrangement 2 and thus the erosion section and the substrate in the ongoing operation, preferably in directions being perpendicular with respect to each other, leads to an alloy gradient in the movement direction of the substrate, as shown in FIG. 2c. The concentration of the first material decreases continuously while the concentration of the second material increases continuously.

Figure 3A:
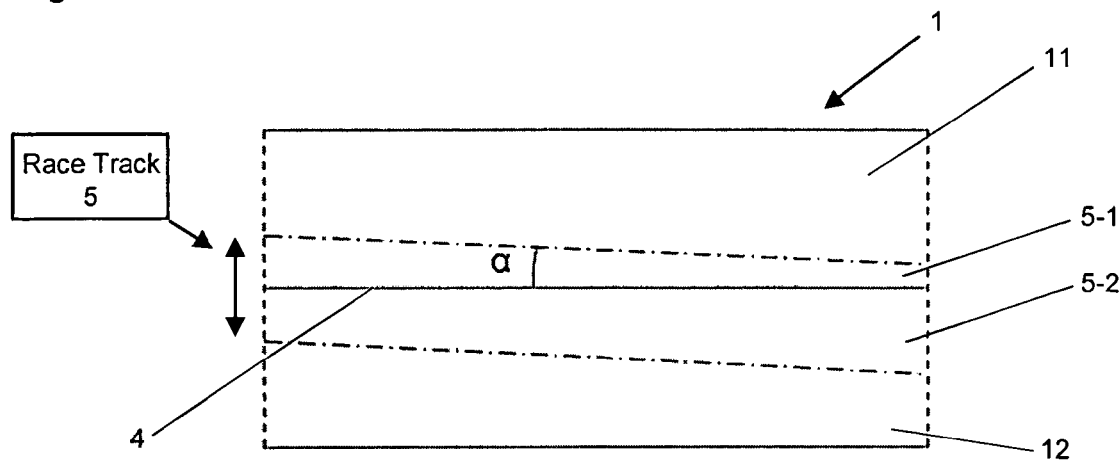
FIGS. 3a and 3b each show a top view of the structure of a target according to a further embodiment of the invention.

In the embodiment according to FIG. 3a, the direction of the erosion section 5 on the target 1 is inclined relative to the boundary line 4 by an acute angle α so that the width of the erosion sub-sections 5-1 and 5-2 varies in the longitudinal direction of the target 1. Depending on the position on the target 1, different alloy compositions are thus achieved.

Figure 3B:
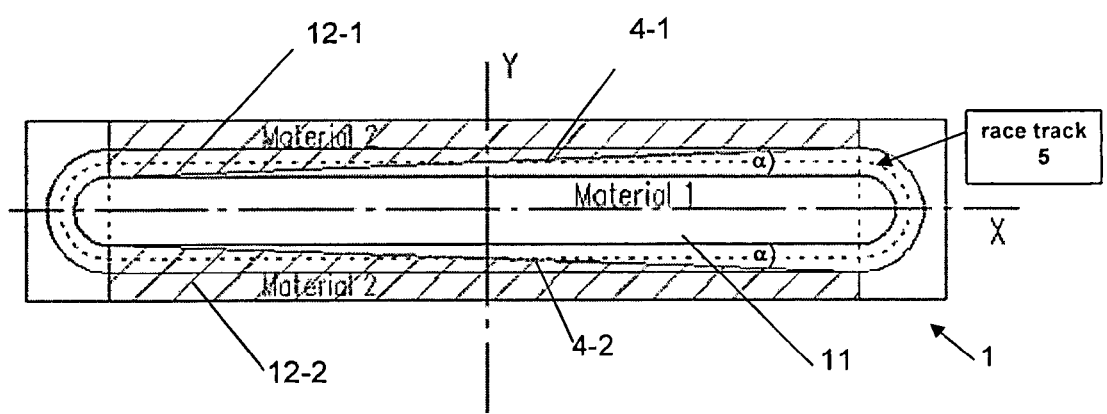

FIG. 3b shows a target according to a further embodiment of the present invention, said target being composed of three individual pieces 11, 12-1, 12-2 which, in the top view of FIG. 3b, each have a trapezoidal shape; adjoining sections are made of different materials: section 12-1 (material 2), section 11 (material 1) and section 12-2 (material 2). The thus formed boundary lines 4-1 and 4-2 between the sections with different materials are inclined relative to the erosion section 5 by an acute angle α. Due to the trapezoidal shape of the individual pieces from which the target according to FIG. 3 is composed and due to their arrangement, both materials are removed simultaneously but in different amounts on the long sections of the race track 5. In particular, in view of the longitudinal direction, first at the one side of the target, namely the right side in FIGS. 3a and 3b, more of material 1 is sputtered and at the other side, i.e. the left side, more of material 2. If a substrate whose diameter corresponds at most to the length of the target is passed during coating below the target along the transverse direction of the target, i.e. in the Y-direction shown in FIG. 3b, a gradient of the concentration of the two materials is formed on the substrate in the X-direction, wherein in the illustration of FIG. 3b material 2 is predominant at the left side and material 1 at the right side. From the left to the right, the concentration of material 2 decreases continuously, while the concentration of material 1 increases continuously.

Figure 4:
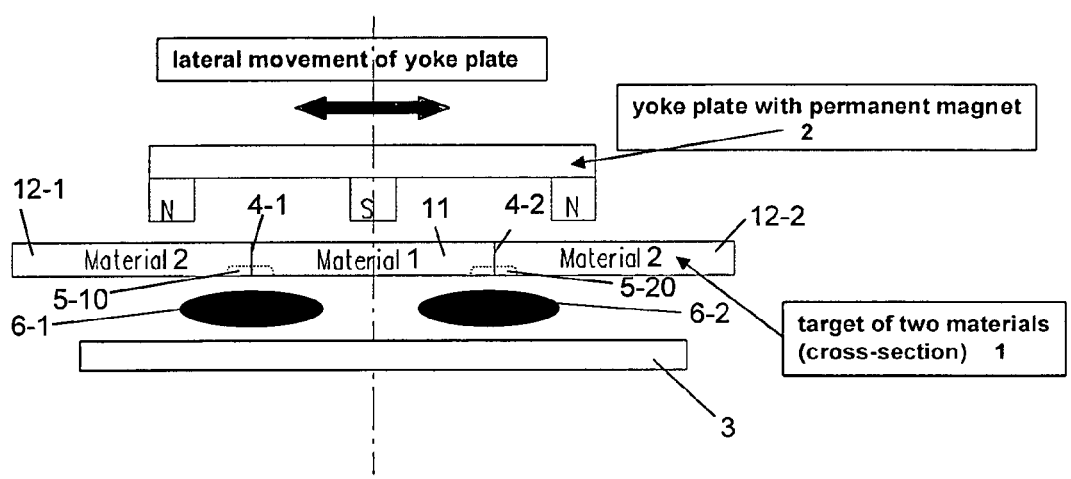
FIG. 4 is a schematic side view of the coating device according to the invention showing the movement of the magnet arrangement.

FIG. 4 schematically shows a cross-sectional view of the coating device according to an embodiment of the invention. The cross-section of the target of FIG. 3b as shown in FIG. 4 is a section along the Y-axis of FIG. 3b. The magnet arrangement 2, which comprises a yoke plate with permanent magnets with pole shoes N, S and N and which is arranged above the target, generates a magnetic field. Under the target, a low pressure plasma 6-1 and 6-2 is formed of the materials of the target. Here, the substrate 3 is placed for being coated. By a movement of the permanent magnets 2, as shown by the arrows above the magnet arrangement, the erosion sections 5-10 and 5-20 formed on the substrate and generated by the magnet arrangement can be moved perpendicularly with respect to the longitudinal extension of the target (in FIG. 4 to the left or right).

Figure 5:
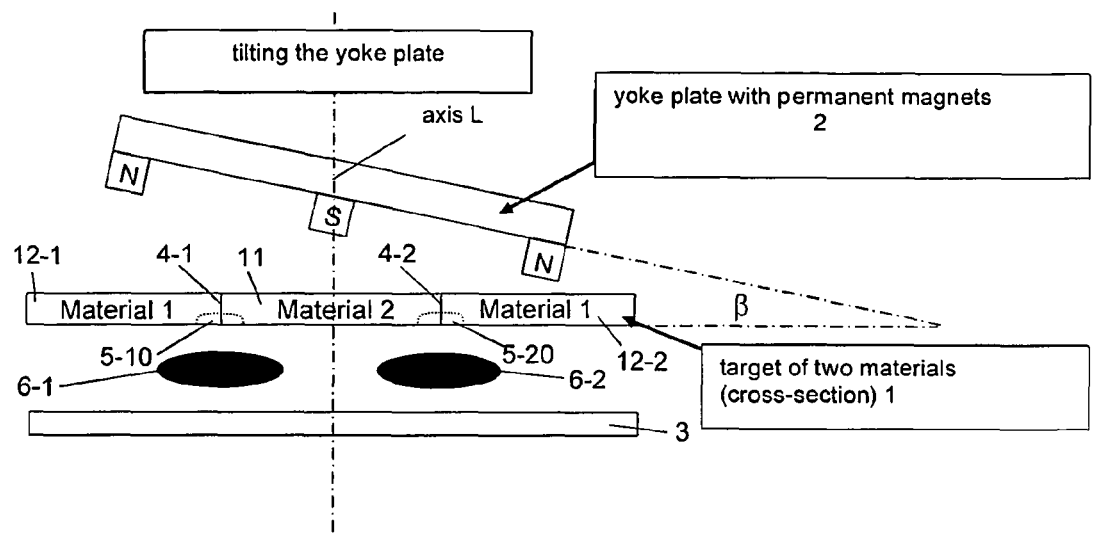
FIG. 5 is a schematic side view of the coating device according to the invention showing the tilting of the magnet arrangement.

According to FIG. 5, the yoke plate 2 with the magnet arrangement can be tilted about the longitudinal axis L of the long cathode (i.e. about an axis being perpendicular with respect to the image plane in FIG. 5). By this tilting, the target removal rates on the two erosion sections 5-10 and 5-20 formed along the target 1 can be changed relative to one another and the alloy ratio and its gradient on the substrate can be changed accordingly.

FIG. 6 exemplarily shows a material distribution on a substrate resulting from the above-described use of the present invention. By a coating with a target as shown in FIG. 3, wherein material 1 is in this case palladium and material 2 iron, the concentration distribution as shown in FIG. 6 is obtained on the surface of the substrate 3 after coating. While on the left side of the substrate mainly iron is deposited, the palladium concentration is high on the right side. In between there is a continuous transition which is characterized by a decrease in the iron concentration and an increase in the palladium concentration.

Figure 7A:
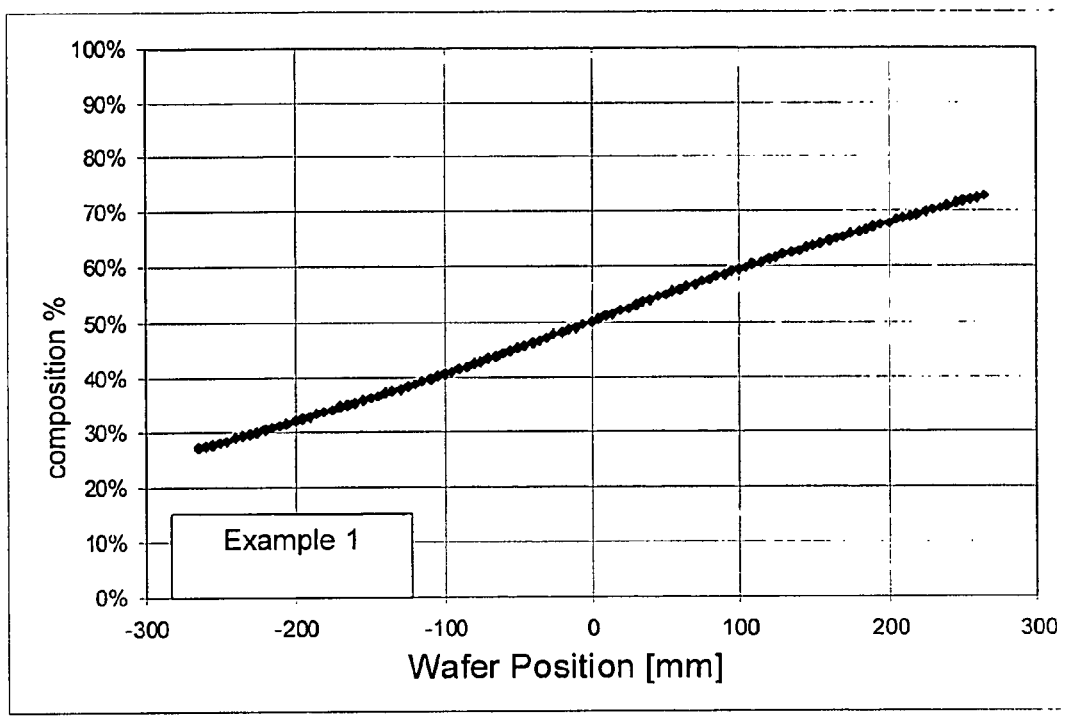
FIGS. 7a and 7b are two examples of the alloy composition with reference to the substrate position with two different gradients.
Figure 7B:
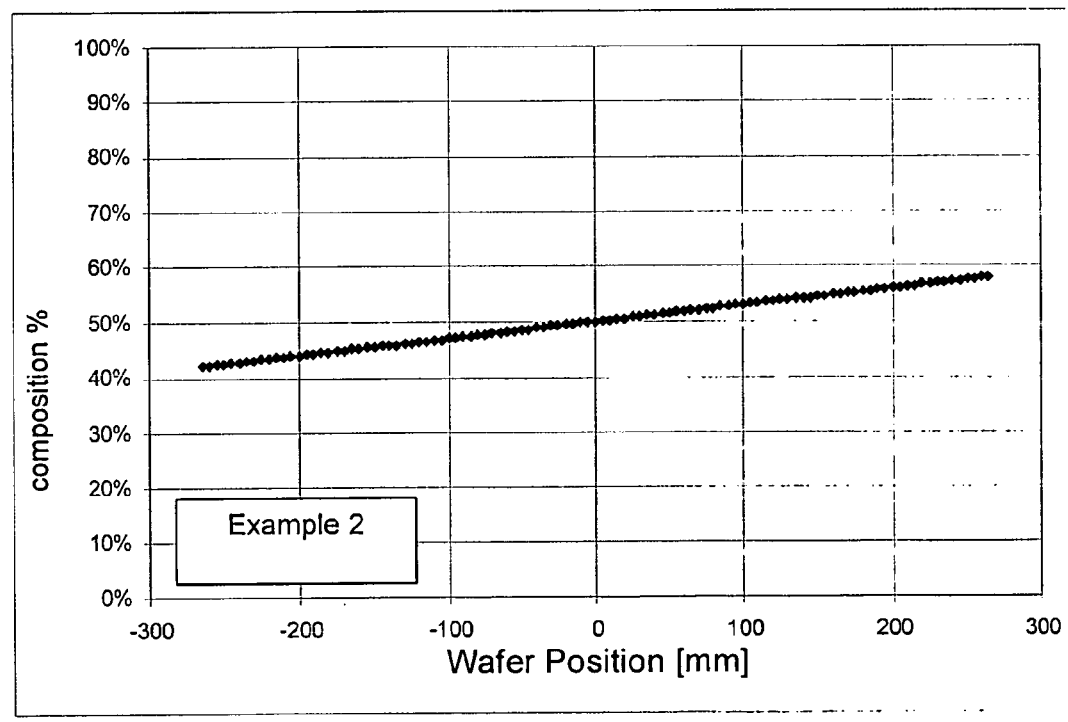

FIGS. 7a and 7b show the concentration of one of the materials of the alloy along the diameter of a substrate, as shown in FIG. 6 using the example of palladium. According to FIGS. 7a and 7b, the concentration (e.g. the Pd concentration) increases continuously from left to right. The differing increase in the concentration has been achieved by a lateral movement of the magnet arrangement, as shown in FIG. 4. FIG. 8 shows that the relative amount can be adjusted by tilting the magnet arrangement, as shown in FIG. 5.

Figure 9B:
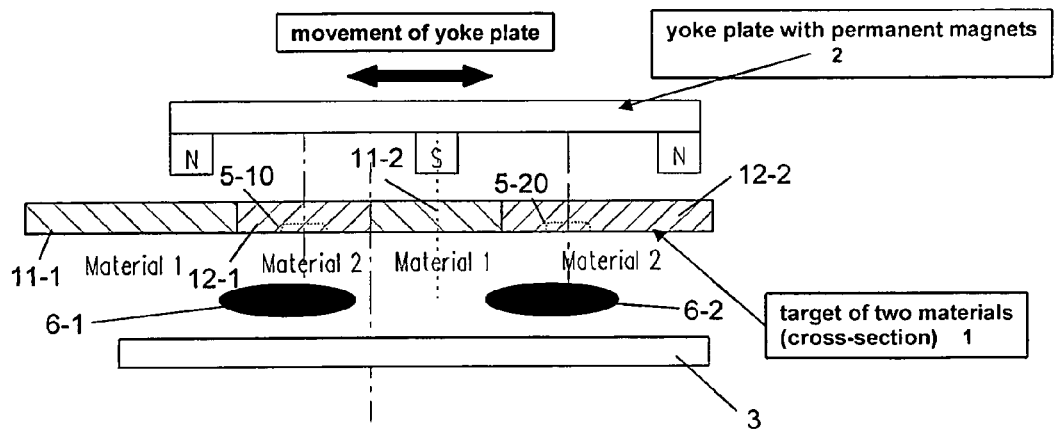
Figure 10:
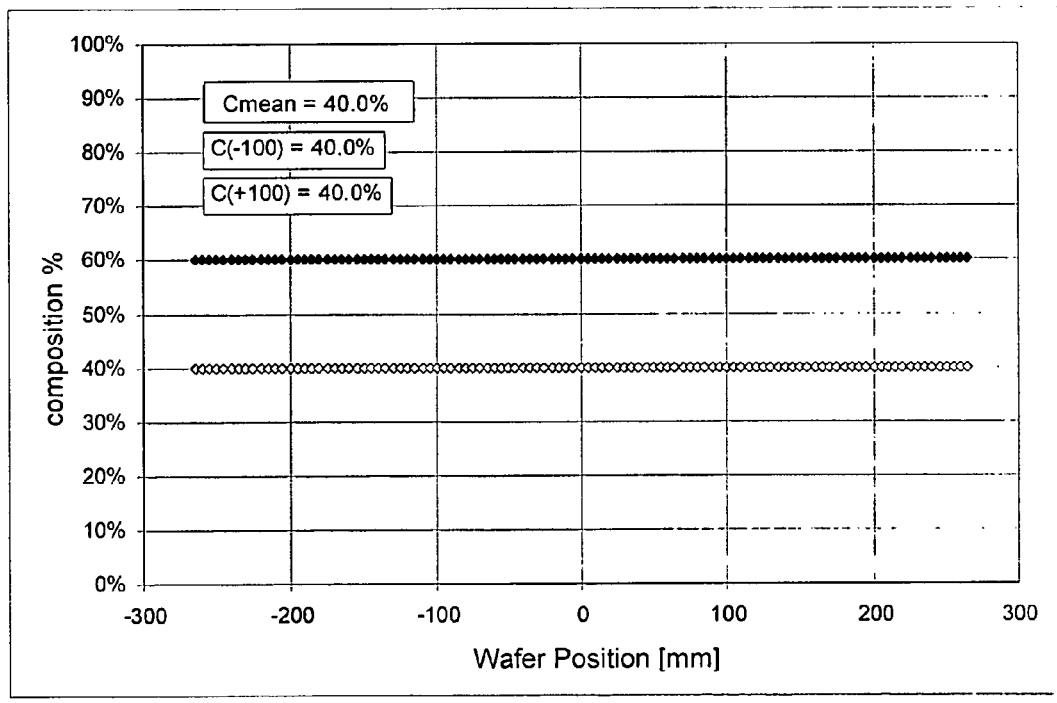
FIG. 10 shows two alloy compositions being constant with reference to the substrate position.

According to a further embodiment of the invention, a homogeneous alloy layer can also be produced across the entire width of the substrate. For this purpose a target 1 as shown in FIG. 9a can be used. The target according to FIG. 9a is combined of e.g., four instead of three material pieces, wherein two pieces 11-1 and 11-2 are made of material 1 and two pieces 12-1 and 12-2 of material 2. The respective target pieces are rectangular, so that material boundaries 4-1, 4-2 and 4-3 extending in the longitudinal direction of the target 1 and the substrate 3 are obtained. The device according to FIG. 9b corresponds to the device shown in FIGS. 4 and 5, wherein, however, in FIG. 9b the target according to FIG. 9a is used. By moving the yoke plate 2 it is possible to adjust the amount of material 1 and material 2 in the alloy formed on the substrate. In the adjustment shown in FIG. 9b, mainly only material 2 is removed from the target, so that a homogeneous layer of this material is formed on the substrate. By moving the magnet arrangement to the left, as indicated in FIG. 9b, the amounts of materials 1 and 2 in the resulting alloy can be controlled in a targeted manner and over a large range. A thus resulting concentration in two different alloy compositions is shown in FIG. 10. The alloy composition is constant over the positions on the substrate 3; however, the amount of one of the materials forming the alloy can be adjusted in a targeted manner.

By suitably structuring the target, it is possible to obtain also other alloy compositions or gradients. For example, it is also possible to use trapezoidal target sections in a four-part target for depositing and adjusting alloy gradients. It is also possible to produce alloys having three or more components by using more than two materials.

According to the invention it is also possible to use electromagnets instead of permanent magnets on the yoke plate.

Figure 11:
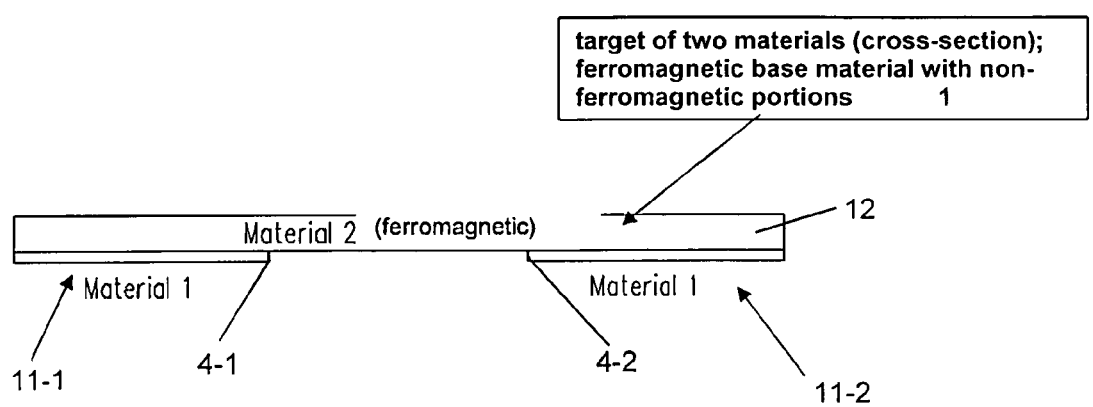
FIG. 11 schematically shows the cross-section of a target according to a further embodiment of the present invention.

According to a further embodiment of the invention (FIG. 11), it is also possible to produce the target 1 of one single base section 12 and to apply the first material 1 only to the desired sections 11-1 and 11-2 of the surface of the base section 12. Such a structure is exemplarily shown in FIG. 11; in this example, the base section 12 is made of ferromagnetic material 2. Material 1 can, e.g., be non-ferromagnetic.

When producing a layer on a substrate by means of cathode sputtering, in accordance with the present invention it is thus possible to apply an alloy having at least two alloy components. When using trapezoidal target pieces according to a first embodiment of the invention, a gradient in the alloy composition can be produced in relation to the position on the substrate, wherein the steepness of the trapezoid determines the basic function of the concentration gradient. When using rectangular target pieces instead of trapezoidal target pieces, a specific homogeneous concentration can be produced across the substrate diameter. Movement of the erosion section perpendicularly with respect to the longitudinal expansion of the target, which can be generated by moving the magnet arrangement in the transverse direction of the target, the steepness of the gradient can be changed when using trapezoidal target pieces. When using rectangular target pieces, such a movement of the magnet arrangement can lead to a change in the homogeneous alloy composition, wherein the effect is particularly significant when using four instead of three target sections. By tilting the magnet arrangement about an axis parallel to the longitudinal direction of the target, it is possible to change the removal rate in the erosion trenches perpendicularly with respect to the longitudinal expansion of the target; it is thus possible to shift the mean rate or also the homogeneous alloy composition in case of rectangular target sections. Such a tilting also allows a compensation for different specific sputtering rates of the alloy components. Alternatively to forming the target of individual target pieces, it is also possible to apply one of the used materials in the desired sections onto a base section of the target. This is particularly appropriate when using a ferromagnetic base section as one of the materials and a further non-ferromagnetic material.

The invention claimed is:

1. A method for coating a plane substrate, which has a width and a length, with an alloy comprising at least a first and a second material as alloy components and having a defined alloy composition by means of magnetron cathode sputtering, comprising:
   (a) an elongate magnetron sputtering cathode extending across the width of the substrate and comprising
      (a1) a target comprising the alloy components, wherein the surface of the target comprises at least a first section of the first material and a second section of the second material, the first section and the second section adjoin each other and form a common boundary line on the surface of the target, and
      (a2) a magnet arrangement which is arranged behind the target when viewed from the substrate for forming at least one erosion section on the surface of the target, said magnet arrangement being aligned with its longitudinal direction parallel with respect to the boundary line in a plane parallel to the surface of the target, wherein
   (b) the erosion section is positioned in the area of the boundary line so that a first part of the erosion section lies on the first target section and a second part of the erosion section lies on the second target section,
   (c) the substrate is linearly moved in its plane below the target during cathode sputtering, characterized by at least one of the following steps:
   (d) adjusting the alloy composition before moving the substrate by
      (d1) moving the erosion section substantially transversely with respect to the boundary line,
      (d2) adjusting an acute angle α between the boundary line and the longitudinal direction of the erosion section in a plane parallel to the surface of the target, and
      (d3) adjusting an angle β between the surface of the magnet arrangement and the surface of the target facing the substrate.

2. The method according to claim 1, comprising moving the substrate in a plane parallel to the target surface and being perpendicular to the boundary line.

3. The method according to claim 1, by tilting the magnet arrangement about an axis extended parallel to the target surface by an angle β.

4. The method according to claim 3, wherein the axis of the magnet arrangement is aligned parallel to the boundary line.

5. The method according to claim 1, wherein the alloy composition is changed depending on the position of the magnet arrangement over the target.

6. The method according to claim 1, wherein the surface of the target is rectangular.

7. A device for coating a plane substrate, with an alloy comprising at least a first and a second material as alloy components and having a defined alloy composition by means of magnetron cathode sputtering, comprising
   (a) an elongate magnetron sputtering cathode extending across the width of the substrate and comprising
      (a1) a target, whereas the substrate is linearly moveable in its plane below the target during sputtering; wherein the surface of the target comprises at least a first section of the first material and a second section of the second material, the first section and the second section adjoin each other and form a common boundary line on the surface of the target, and
      (a2) a magnet arrangement which is arranged behind the target when viewed from the substrate for forming at least one erosion section on the surface of the target, said magnet arrangement being aligned with its longitudinal direction parallel with respect to the boundary line in a plane parallel to the surface of the target, wherein
   (b) the magnet arrangement is subject to at least one of the following features
      (b1) the magnet arrangement is movable in a direction parallel with respect to the target surface and perpendicular with respect to the boundary line of the target or at an angle α relative to the boundary line,
      (b2) the magnet arrangement is tiltable about an axis relative to the target surface by an angle β or the target surface is tiltable about an axis relative to the magnet arrangement by an angle β, and
      (b3) the magnet arrangement is adjustable relative to the boundary line at an angle α.

8. The device according to claim 7, wherein the magnetron sputtering cathode is formed as a long cathode.

9. The device according to claim 7, wherein the magnet arrangement comprises permanent magnets or electromagnets.

10. A method for coating a plane substrate, which has a width and a length, with an alloy comprising at least a first and a second material as alloy components and having a defined alloy composition by means of magnetron cathode sputtering, comprising:
   (a) an elongate magnetron sputtering cathode extending across the width of the substrate and comprising
      (a1) a target comprising the alloy components, wherein the surface of the target comprises at least a first section of the first material and a second section of the second material, the first section and the second section adjoin each other and form a common boundary line on the surface of the target, and
      (a2) a magnet arrangement which is arranged behind the target when viewed from the substrate for forming at least one erosion section on the surface of the target, wherein
   (b) the erosion section is positioned in the area of the boundary line so that a first part of the erosion section lies on the first target section and a second part of the erosion section lies on the second target section,
   (c) the substrate is linearly moved in its plane below the target during cathode sputtering, characterized by at least one of the following steps:
   (d) adjusting the alloy composition before moving the substrate by
      (d1) moving the erosion section substantially transversely with respect to the boundary line, (d2) adjusting an acute angle α between the boundary line and the longitudinal direction of the erosion section in a plane parallel to the surface of the target, and (d3) adjusting an angle β between the surface of the magnet arrangement and the surface of the target facing the substrate;

(e) wherein by aligning the magnet arrangement with its longitudinal direction at an angle α with respect to the boundary line in a plane parallel to the surface of the target, a gradient of the concentration of the two materials is formed on the substrate in a direction parallel to the longitudinal direction of the magnet arrangement.

* * * * *